Jan. 25, 1966 G. DONCESE ETAL 3,231,826
WIDE-BAND DOUBLE-TUNED CIRCUIT FOR ONE-PORT PARAMETRIC AMPLIFIER
Filed Dec. 11, 1962 2 Sheets-Sheet 1

$$\rho = \frac{Z - Z_0}{Z + Z_0}$$

United States Patent Office 3,231,826
Patented Jan. 25, 1966

3,231,826
WIDE-BAND DOUBLE-TUNED CIRCUIT FOR ONE-PORT PARAMETRIC AMPLIFIER

George Doncese, Glen Cove, and Richard La Rosa, South Hempstead, N.Y., assignors to Hazeltine Research Inc., a corporation of Illinois Filed Dec. 11, 1962, Ser. No. 243,877
2 Claims. (Cl. 330—4.9)

This invention relates to wide-band (with respect to frequency) one-port parametric amplifiers and methods for achieving such wide-band operation in combination with high gain.

Much effort is currently being directed toward the development of low-noise microwave amplifiers using one-port reflection-type amplifier stages. Such amplifiers commonly use voltage sensitive variable capacitance diodes, the capacitance of which is made to vary periodically by application of a sinusoidal microwave signal supplied by an oscillator called a pump.

The objects of this invention are to increase the bandwidth and gain available from such amplifiers while simultaneously allowing circuit simplification in many instances.

In accordance with the invention a wide-band one-port parametric amplifier comprises a time-varied nonlinear reactance (a) for reflecting signals with a reflection coefficient greater than unity, nonreciprocal network means (b) for separating incoming signals to be amplified from outgoing amplified signals, and transmission line means (c) intercoupling nonlinear reactance (a) and network means (b) for providing a double-tuned circuit consisting of the reactances of the signal-handling portions of nonlinear reactance (a), network means (b) and transmission line means (c).

For a better understanding of the present invention, together with other objects thereof, reference is had to the following description taken in connection with the accompanying drawings, and its scope will be pointed out in the appended claims.

In the drawings FIGS. 1 and 2 are circuit diagrams, partially schematic of wide-band one-port parametric amplifiers in accordance with the invention;

Figure 1:
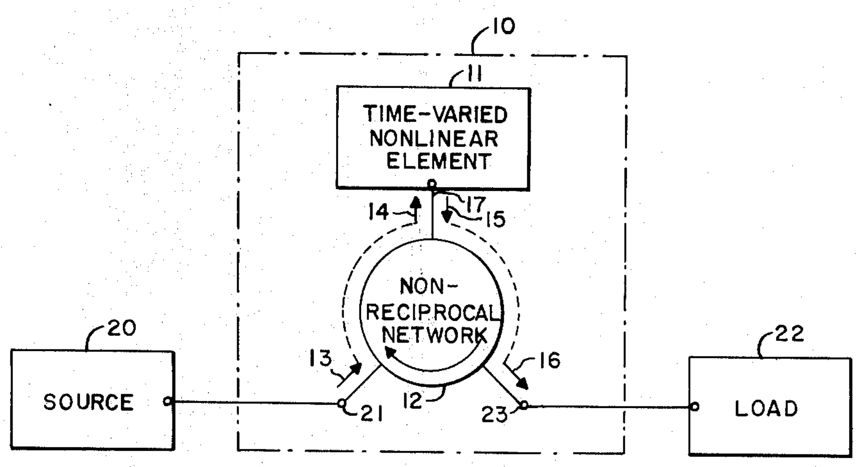

Referring now to FIG. 1 of the drawing, the present invention deals with the type of one-port parametric amplifier illustrated therein.

Figure 2:
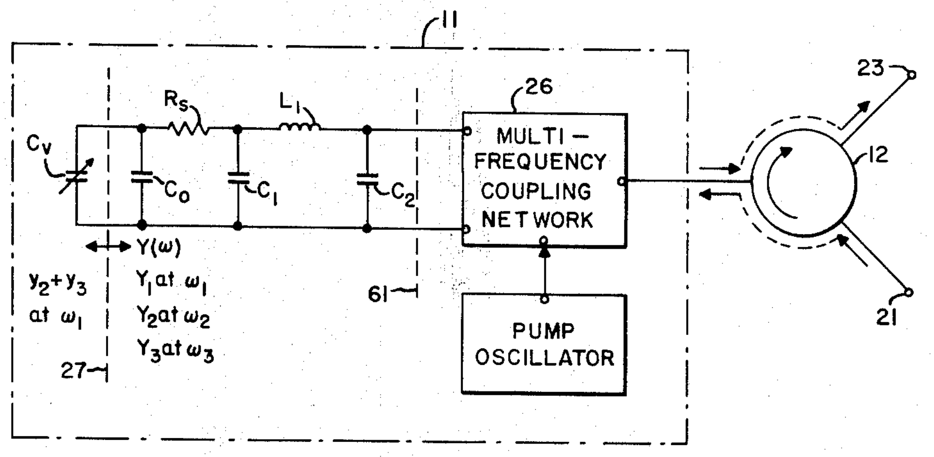

*Description of FIGS. 1 and 2*

FIG. 1 shows a one-port parametric amplifier 10 which includes a time-varied nonlinear element 11 which provides a reflection coefficient greater than unity. This time-varied nonlinear element may, for example, be a nonlinear dielectric, a ferrite, or a junction diode used as a capacitor. This element 11 is a one-port device, a "port" is a pair of terminals and a one-port device uses one pair of terminals for both input and output. Power from some external source flowing into a one-port device with a reflection coefficient greater than unity will result in an outgoing flow of power greater than the incident power. However, we cannot tell what part of the power at the port belongs to the incident flow and what part belongs to the emergent flow. Therefore, the amplifier also includes nonreciprocal network means 12 for separating incoming signals to be amplified from outgoing amplified signals.

In FIG. 1, network means 12 is shown as a circulator wherein entering power indicated by arrow 13, leaves as indicated by arrow 14; and power entering network means 12 as indicated by arrow 15, leaves as indicated by arrow 16. Such nonreciprocal networks commonly use ferrite material subject to a steady magnetic field to provide this nonreciprocal result. Circulators such as that illustrated are well-known in the art.

The amplifier 10 further includes transmission line means illustrated schematically as line 17. The function and design of transmission line means 17 will be described in greater detail below.

FIG. 1 shows a source 20 connected to the input 21 of network 12 and a load 22 connected to the output 23 of network 12. Thus, it becomes apparent that amplifier 10 in its entirety is not strictly a "one-port" device because it has two ports 21 and 23. However, since the basic amplification element 11 is actually a one-port device, the whole amplifier 10 will be called a one-port amplifier.

The invention will now be described in detail with particular reference to an amplifier using a pumped variable capacitance diode to provide the function of a time-varied nonlinear element. For purposes of analysis the capacitance of a variable capacitance diode, such as just mentioned, can be considered as including a fixed capacitance and a time-varying capacitance.

The circuit elements adjacent to the time-varying capacitance, in an amplifier of the type under discussion, are prescribed by the diode package. In FIG. 2 the circuit to the left of vertical dashed line 61 shows the equivalent circuit of a junction diode when it is used as a pumped variable capacitor. The variable capacitance is the depletion layer of the p-n junction near the top of the mesa (inside the diode package). In the equivalent circuit, this capacitance has been represented as a fixed capacitor $C_0$ in parallel with the sinusoidally varying capacitance $C_V$ whose peak-to-peak variation is 4C. The resistance $R_S$ is due to the fact that when charges move through the volume of the semiconductor material they collide with the atoms in the crystal lattice. The metal diaphragm (or equivalent structure for providing contact) which presses on the point of the semiconductor has some capacitance to the semiconductor mass. This is part of $C_1$ in FIG. 2. Currents entering and leaving the junction must flow radially between the point of the semiconductor and the rims of the contact plates. These currents are flowing on a short length of radial or conical transmission line. The $\pi$ equivalent circuit of a short length of transmission line can be considered as taking the form of the total distributed inductance of the line segment lumped into one series inductive element $L_1$ and the total distributed capacitance split between two lumped shunt capacitors one at each end of the inductance. One of these capacitors is absorbed into $C_1$. The fringing between the contact discs and the capacitance presented by the ceramic combines with the second distributed capacitance of the radial line to form $C_2$ in FIG. 2.

These parasitic elements are extremely important because they form resonant circuits at pump, idler, and upper-sideband frequencies. In the example to be discussed, the frequencies involved are 425 mc.±25 mc. for the signal frequency, 5925 mc. for the pump frequency, 5500 mc.±25 mc. for the idler frequency and 6350 mc.±25 mc. for the upper-sideband frequency. As we will subsequently see, the effect of the inherent parasitic reactances is great enough so that completion of the entire idler circuit of the actual amplifier described required only the addition of a small variable inductance and a capacitor.

The external terminals of the diode are connected to a circuit shown as 26 in FIG. 2 which has many functions, including:

- connecting the circulator to the diode;
- getting sufficient pump voltage swing on the diode;
- providing proper terminations for the diode at $\omega_2$ and $\omega_3$;
- applying D.-C. bias to the varactor;
- adjusting impedance at each frequency independently if possible, and
- preventing anything but $\omega_1$ power from escaping via the circulator.

The pumped nonlinear capacitor acts as a frequency translator in this circuit. In FIG. 2, the element responsible for this frequency translation is the fundamental pump-frequency part of the time-varying capacitance $C_v$ shown to the left of dashed line 27. The average junction capacitance $C_0$ plays no part in the frequency translation and is shown to the right of the line 27.

Incoming power at signal frequency ($\omega_1$) is converted into lower sideband (idler) frequency ($\omega_2$) power and upper sideband frequency ($\omega_3$) power. The admittances $Y_2$ and $Y_3$ presented to the terminals of the translator at frequencies $\omega_2$ and $\omega_3$ absorb or reflect portions of this power. The reflected part is converted back to $\omega_1$ power which leaves the translator. This action is summarized by saying that the power incident on the translator encounters the admittance $y_2+y_3$ effective at signal frequency. These coupled-in admittances ($y_2$ and $y_3$) have been computed in many published papers from simultaneous equations relating charge to voltage at the three frequencies of interest. The results are given below:

$$y_2=\frac{-\omega_1\omega_2C^2}{Y_2} \qquad (1)$$

$$y^3=\frac{\omega_1\omega_3C^2}{Y_3} \qquad (2)$$

Where C is half of the peak value of the fundamental capacitance variation.

The admittance coupled in from the round-trip translation from $\omega_1$ domain to $\omega_3$ domain back to $\omega_1$ domain is very similar to what a coupled circuit would do. $y_3$ will always have positive conductance.

The round-trip translation from $\omega_1$ domain to $\omega_2$ domain back to $\omega_1$ domain creates quite a different result. $Y_2$ has positive conductance, since it is the admittance looking into a passive circuit at $\omega_2$. $y_2$ will have negative conductance (the distinction between $Y_2$ and $y_2$ must be kept in mind). This negative conductance appears approximately in parallel with $C_0$, $C_1$, $C_2$, and any extra capacitance which might appear in parallel with $C_2$. The series elements $R_s$ and $L_1$ in FIG. 2, may modify this statement to some extent, but the point of view is a useful guide. It shows us that the negative conductance in $y_2$ should be maximized so that it is not swamped out by shunt capacitance. This, in turn, says that the susceptance in $Y_2$ should be minimized over the band of frequencies occupied by $\omega_2$. Moreover the conductance in $Y_2$ should be a minimum.

Figure 3:
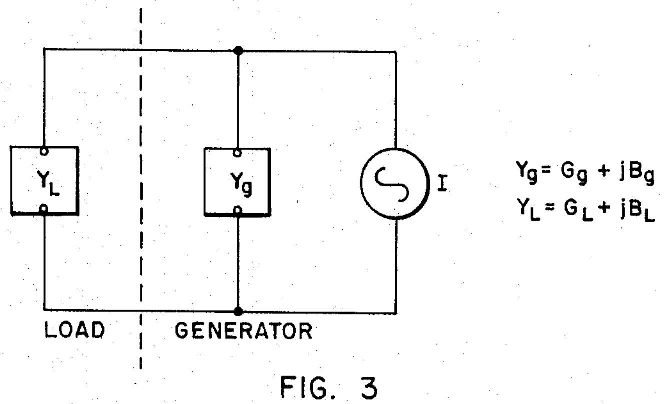
FIG. 3 is a diagram used in defining terms.

Now we can show why the reflection coefficient magnitude can be greater than unity. A mathematical definition of reflection coefficient is required. FIG. 3 shows a generator connected to a load. The available power of the generator is:

$$P_{\text{avail}}=\frac{|I^2|}{4G_g} \qquad (3)$$

and the power absorbed by the load is:

$$P_{\text{load}}=\frac{|I^2|G_L}{|Y_L+Y_g|^2} \qquad (4)$$

The power reflected is:

$$P_{\text{ref}}=P_{\text{avail}}-P_{\text{load}}=|I^2|\left(\frac{1}{4G_g}-\frac{G_L}{|Y_L+Y_g|^2}\right) \qquad (5)$$

The reflection coefficient magnitude squared is the ratio of reflected power to available power:

$$|P|^2=\frac{P_{\text{ref}}}{P_{\text{avail}}}=1-\frac{4G_gG_L}{|Y_L+Y_g|^2}=$$

$$\frac{G_g^2+2G_gG_L^2+(B_L+B_g)^2-4G_gG_L}{|Y_L+Y_g|^2}=$$

$$\frac{(G_g-G_L)^2+(B_g+B_L)^2}{(G_g+G_L)^2+(B_g+B_L)^2}=$$

$$\left|\frac{Y_g-Y_L^*}{Y_g+Y_L}\right|^2=\left|\frac{Y_L-Y_g^*}{Y_L+Y_g}\right|^2 \qquad (6)$$

There are many alternative forms for this expression which are convenient for different applications. Likewise there are many ways of deriving it. It says, essentially, that power reflection is caused by departure from conjugate match.

This reflection coefficient magnitude is the same no matter where the network is broken as long as it is lossless. This means that as far as the reflection coefficient seen by the circulator in FIG. 2 is concerned the circuit can be separated into generator and load at any point to the right of $R_s$. The conductance to the right of the break point is positive, but the conductance to the left of the break point can be negative by virtue of the negative conductance of $y_2$ as given by Equation 1. Expression 6 shows that if the generator has positive conductance and load has negative conductance, the real terms will reinforce in the numerator and tend to cancel in the denominator. This makes reflection coefficient greater than unity. It will not be very large, however, unless the two susceptances cancel fairly well compared to the net conductance.

The positive resistance $R_s$ detracts from the negative conductance presented by the frequency translator in the term $y_2$. This is only one of many reasons why diodes of lowest possible $R_s$ are sought.

It is not possible to say much more of value in a general way here, therefore, an amplifier which was actually constructed in accordance with the invention will now be described by way of example.

Figure 4:
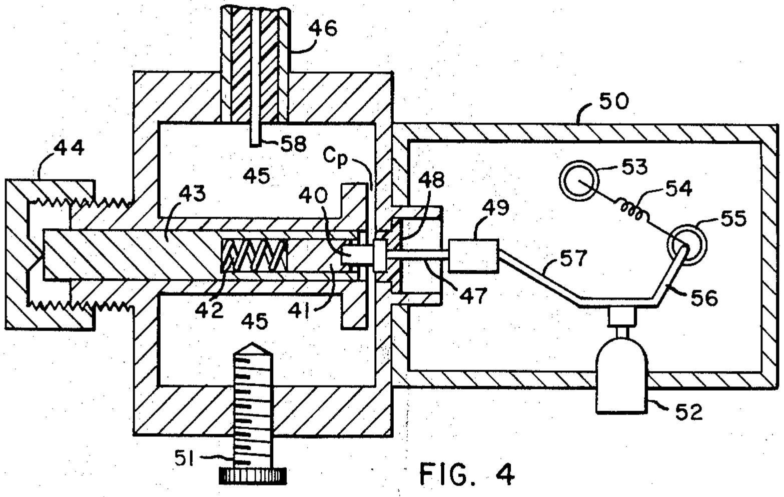
FIG. 4 is a view of an actual amplifier constructed in accordance with the invention (some dimensions in this view have been distorted in the interest of clarity of illustration)
Figure 5:
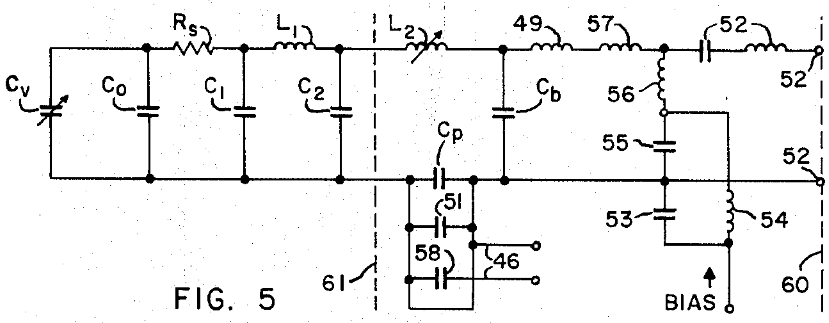
FIGS. 5 and 6 are schematic diagrams of portions of parametric amplifiers in accordance with the invention.

*Amplifier of FIGS. 4 and 5*

FIG. 4 is a sketch of a cross section of an actual one-port parametric amplifier designed for use in the UHF range (425 mc. ±25 mc.) and FIG. 5 shows the equivalent circuit. A pump klystron running at 5925 mc. and a silicon pill diode 40 are used. The diode 40 is about ⅛ inch long and ⅛ inch in diameter. One end presses against a spring loaded piston 41. The other end of the spring 42 presses against a plunger 43 which completely surrounds the contact piston 41 and partially surrounds the diode 40. A threaded knob 44 presses against this plunger 43 to adjust its position. This plunger 43 forms the small idler tuning inductance $L_2$ in series with the diode in FIG. 5. The outer conductor of the diode enclosure is broken by a capacitive gap $C_p$ which opens into the end of a coaxial annular cavity 45 surrounding the diode mount. The cavity 45 is tuned to pump frequency and is fed by a coaxial line 46 (ending in a probe 58) which connects to the pump oscillator. The function of the pump feed cavity 45 is to establish a large pump current through the comparatively low reactance of capacitive gap $C_p$. At idler frequency $C_p$ is essentially not shunted by the cavity which has fairly high impedance at frequencies differing from resonance. The cavity conducting path has low enough inductance at $\omega_1$ to effectively short out $C_p$.

The diode circuit at $\omega_2$ is completed by the capacitance $C_b$ of diode contact 47 to ground through dielectric piece 48 which provides mechanical support for contact 47. The small choke 49 is designed to present an open circuit at $\omega_2$, $\omega_p$, and $\omega_3$ so that no microwave energy gets out into the UHF circuit box 50. The design of a choke for this use is simplified by the fact that all three of the microwave frequencies to be open-circuited are very close together. They cover a band of only 900 mc. centered at 5925 mc. Also, the low signal frequency allowed the use of a very high characteristic impedance for the choke because the large inductive reactance at UHF could be absorbed in the UHF tuning circuit.

The remainder of the components shown in FIG. 4 include a pump cavity capacitive tuning screw 51, a coaxial connector 52 which connects directly to the connector of a circulator, and a few components in UHF box 50 which are concerned with application of a bias signal. The nature of these last mentioned components is indicated in FIG. 5.

Figure 6:
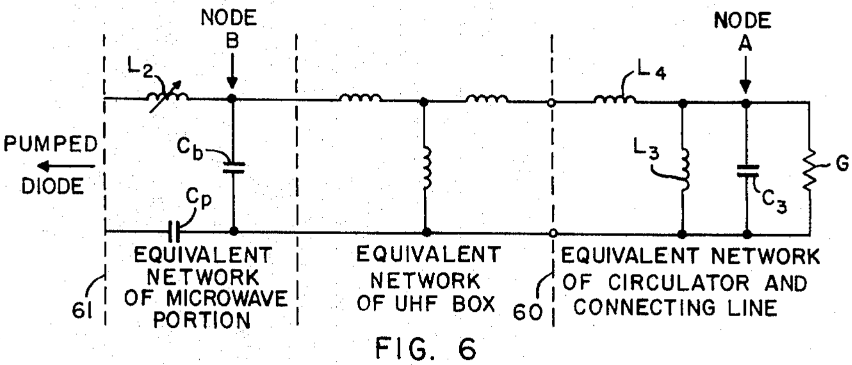

*Analysis of FIG. 6*

In this design the UHF circuit is essentially double tuned on a node basis for maximally flat response over the desired frequency range. The amplifier could have been designed to form a circuit with other types of response characteristics and bandwidth as desired. The two nodes are shown in FIG. 6, which is a somewhat simplified version of FIG. 5 with a lumped equivalent circuit approximating the impedance of the circulator as seen from the coaxial connector 52, and with the diode equivalent circuit deleted. The dotted lines 60 and 61 in FIGS. 5 and 6 indicate the points at which the circuit has been added to or cut off. Node "B" is the diode contact capacitance $C_b$. Node "A" as indicated in FIG. 6, is not physically accessible because it is internal to the lumped equivalent circuit which approximates the impedance of the circulator seen from the solder lug of the coaxial connector 52.

$Y_{bb}$ is the total admittance at node B with node A grounded, $Y_{aa}$ is the total admittance at node A with node B grounded, and $Y_{ab}$ is the short-circuit mutual admittance between nodes. The total admittance at node A is:

$$Y_{aa}-\frac{Y_{ab}^2}{Y_{bb}} \qquad (7)$$

Since $Y_{ab}$ is almost entirely due to an equivalent mutual inductance $L_{ab}$ ($\pi$ equivalent) the total admittance at node A becomes:

$$Y_{aa}+\frac{\frac{1}{\omega^2 L^2_{ab}}}{Y_{bb}} \qquad (8)$$

where $\omega$ is the signal radian frequency.

The source admittance is assumed to be the fictitious node conductance G and the remainder of Equation 8 is considered to be the load. The one-port reflection coefficient (gain) is:

$$\frac{G-\left(jB_{aa}+\frac{1/\omega^2L^2_{ab}}{Y_{bb}}\right)}{G+\left(jB_{aa}+\frac{1/\omega^2L^2_{ab}}{Y_{bb}}\right)} \qquad (9)$$

where:

$$Y_{aa}=G+jB_{aa} \qquad (10)$$

The inverted $Y_{bb}$, as called for in Equation 8, is an almost constant negative conductance in parallel with a susceptance that has a negative rate of change with increasing $\omega$. (A slight detuning of both nodes compensates for the variation of $\omega$ in the numerator of the inversion.)

The susceptance $B_{aa}$ has a positive rate of change, and if it has the right magnitude, it can cancel the susceptance coupled in from node B. This is desired as a means of keeping the reflection coefficient (Equation 9) relatively constant in the pass band. The parameter which describes the rate of change of $B_{aa}$ relative to the conductance G is the loaded Q of node A which is given by:

$$Q_a=\frac{\omega_0 C_3}{G} \qquad (11)$$

where $\omega_0$ is the band-center radian signal frequency.

The $Q_a$ is relevant because the ratio of G to the negative conductance coupled from node B remains constant for a given reflection coefficient magnitude. Hence the susceptance $B_{aa}$ is related through $Q_a$ and gain to the susceptance coupled from node B.

The only parameter available for adjusting $Q_a$ in the simple circuit of FIG. 6 is the line length between the circulator and the inductive coupling network. The remainder of the present discussion derives $Q_a$ in terms of this line length.

Circulators as purchased have connectors coupled to the transmission line of some characteristic impedance $Z_0$ (usually 50 ohm coax for signal frequencies below C-band). The manufacturer has usually taken pains to make the mid-band impedance equal to $Z_0$ at band center. It is assumed here that the impedance locus (in the complex impedance plane) is a simple straight line yielding a reflection coefficient that can be described by:

$$\rho=\frac{Z-Z_0}{Z+Z_0}\cong -a\frac{\omega-\omega_0}{\omega_0}e^{-j\theta} \qquad (12)$$

Figure 7:
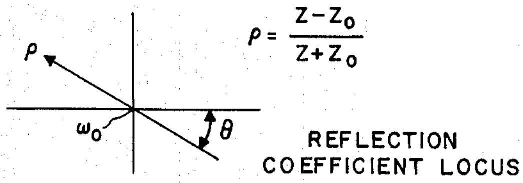
FIG. 7 is a polar coordinate diagram used in describing the invention.

The line length controls the angle $\theta$ that the reflection coefficient locus makes with the real axis as shown in FIG. 7.

The impedance Z in terms of the parameters of FIG. 6 is:

$$Z=j\omega L_4+\frac{1}{G+j\omega C_3+\frac{1}{j\omega L_3}} \qquad (13($$

The band center constraint $Z=Z_0$ gives:

$$Z_0=j\omega L_4+\frac{1}{G+j\omega_0 C_3+\frac{1}{j\omega_0 L_3}} \qquad (14)$$

The logical procedure is to use the real and imaginary part of Equation 14 to eliminate $L_4$ and $L_3$, and then to equate $$Z-Z_0\cong 2Z_0\rho\cong -2Z_0 a\frac{\omega-\omega_0}{\omega_0}e^{-j\theta} \qquad (15)$$

and use the real and imaginary parts of Equation 15 to obtain G and $C_3$. This logical procedure leads to a lot of algebra which cancels out in the end to give a simple answer.

The result of this algebraic approach, including an approximation that $\omega$ can be replaced by $\omega_0$, is:

$$Q_a=\sqrt{a^2+a\cos\theta} \qquad (16)$$

This result (Equation 16) shows that the maximum loaded Q of node A is obtained when the circulator connection is made through a line length which makes $\theta=0$. The equivalent circuit of FIG. 6 is only valid between $\theta=-\pi/2$ and $\theta=\pi/2$. In the particular example already described, the value of "a" was approximately 3.1. This gives a variation of $Q_a$, over the range of $\theta$ from $-\pi/2$ to $\pi/2$, of 3.1 to 3.56. This does not seem like much variation but it must be remembered that the denominator of gain Expression 9 is quite sensitive to errors in susceptance cancellation because the two conductance terms have opposite sign. Using this approach, the line length can be chosen to provide maximally flat response as here, or other types of response characteristics of desired bandwidth, in accordance with the invention.

Experimental amplifiers in accordance with the invention have provided 17 db gain with a gain variation over a band of 406–450 mc. of ±0.5 db and a 2 db overall noise figure with post amplifiers with a noise figure of 7 db. Amplifiers have been turned out for production with 9.5 db of gain per stage, a principal limitation on the maximum gain being due to limitations of present circulators to provide adequate reverse-direction isolation above certain gain limits. At the time these amplifiers were built and operated, most workers in this field did not believe that such gains and bandwidths could be obtained from the type of amplifier involved without the insertion of additional tuning elements.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A wide-band one-port parametric amplifier comprising:

a time-varied nonlinear reactance (a) for reflecting signals with a reflection coefficient greater than unity;
nonreciprocal network means (b) for separating incoming signals to be amplified from outgoing amplified signals;
and transmission line means (c) intercoupling nonlinear reactance (a) and network means (b) for providing a double-tuned circuit consisting of the reactances of the signal-handling portions of nonlinear reactance (a), network means (b) and transmission line means (c).

2. A wide-band one-port parametric amplifier comprising:

a time-varied variable capacitance diode (a);
ferromagnetic circulator means (b) for separating incoming signals to be amplified from outgoing amplified signals;
and transmission line means (c) intercoupling diode (a) and circulator means (b) for providing a double-tuned circuit consisting of the reactances of the signal-handling portions of diode (a), circulator means (b) and transmission line means (c).

References Cited by the Examiner

UNITED STATES PATENTS 3,040,267 6/1962 Seidel -------------- 330—4.9

OTHER REFERENCES

Gilden et al.: "IRE Transactions on Microwave Theory and Techniques," November 1961, pages 484–490.

Kliphuis: "Proceedings of the IRE," May 1961, page 961.

Kuh: "Proceedings of the IRE," January 1962, pages 31–38.

Vincent et al.: "1962 International Solid-State Circuits Conference, Digest of Technical Papers," pages 20–21.

ROY LAKE, *Primary Examiner.*